(12) United States Patent
Ikeda et al.

(10) Patent No.: US 12,083,559 B2
(45) Date of Patent: Sep. 10, 2024

(54) VIBRATING DEVICE AND MANUFACTURING METHOD OF THE SAME

(71) Applicant: Murata Manufacturing Co., Ltd., Nagaokakyo (JP)

(72) Inventors: Kazuyuki Ikeda, Nagaokakyo (JP); Kenji Kagayama, Nagaokakyo (JP); Shogo Tokoi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 648 days.

(21) Appl. No.: 17/371,179

(22) Filed: Jul. 9, 2021

(65) Prior Publication Data
US 2021/0331205 A1 Oct. 28, 2021

Related U.S. Application Data

(63) Continuation of application No. PCT/JP2020/005582, filed on Feb. 13, 2020.

(30) Foreign Application Priority Data

Feb. 22, 2019 (JP) ................. 2019-030109

(51) Int. Cl.
*B06B 1/06* (2006.01)
*H04R 17/00* (2006.01)

(52) U.S. Cl.
CPC .......... *B06B 1/0629* (2013.01); *B06B 1/0603* (2013.01); *B06B 1/0648* (2013.01); *B06B 1/0666* (2013.01); *H04R 17/00* (2013.01)

(58) Field of Classification Search
CPC ................................... B06B 1/0666
See application file for complete search history.

(56) References Cited

U.S. PATENT DOCUMENTS 6,587,567 B1    7/2003  Yamamoto
8,989,412 B2 *  3/2015  Fujise ............... H04R 17/00
                                                        310/330

(Continued)

FOREIGN PATENT DOCUMENTS

CN    108472687 A    8/2018
JP    55-88881 U     6/1980

(Continued)

OTHER PUBLICATIONS

Official Communication issued in corresponding Chinese Patent Application No. 202080010953.X, mailed on Jan. 19, 2022.

(Continued)

*Primary Examiner* — Bryan P Gordon
(74) *Attorney, Agent, or Firm* — Keating & Bennett, LLP

(57) ABSTRACT

A vibrating device includes a diaphragm that includes first and second vibrating portions and a fixation portion, first and second piezoelectric vibrators that are provided at the first and second vibrating portions, respectively, and fixation electrodes. The fixation portion includes a first side portion and a second side portion that extend in different directions. The diaphragm and the fixation electrodes are provided integrally as a single monolithic member. The first vibrating portion extends from the first side portion and the fixation electrodes extend from the second side portion.

15 Claims, 8 Drawing Sheets

(56) References Cited

U.S. PATENT DOCUMENTS

| | | | |
|---|---|---|---|
| 2003/0021458 A1 | 1/2003 | Hamada et al. | |
| 2017/0028441 A1 | 2/2017 | Kagayama et al. | |
| 2017/0083098 A1* | 3/2017 | Usui | G06F 1/1626 |
| 2018/0131346 A1* | 5/2018 | Kagayama | H10N 30/2042 |
| 2020/0373857 A1* | 11/2020 | Endo | B06B 1/0688 |
| 2021/0331205 A1* | 10/2021 | Ikeda | H10N 30/50 |

FOREIGN PATENT DOCUMENTS

| | | |
|---|---|---|
| JP | 60-20454 Y2 | 6/1985 |
| JP | 10-200994 A | 7/1998 |
| JP | 2003-023697 A | 1/2003 |
| KR | 10-2014-0103878 A | 8/2014 |
| WO | 2015/163166 A1 | 10/2015 |

OTHER PUBLICATIONS

Official Communication issued in corresponding Chinese Patent Application No. 202080010953.X, mailed on Apr. 13, 2022.
Official Communication issued in International Patent Application No. PCT/JP2020/005582, mailed on Apr. 28, 2020.

\* cited by examiner

VIBRATING DEVICE AND MANUFACTURING METHOD OF THE SAME

CROSS REFERENCE TO RELATED APPLICATIONS

This application claims the benefit of priority to Japanese Patent Application No. 2019-030109 filed Feb. 22, 2019 and is a Continuation Application of PCT Application No. PCT/JP2020/005582 filed on Feb. 13, 2020. The entire contents of each application are hereby incorporated herein by reference.

BACKGROUND OF THE INVENTION

1. Field of the Invention

The present invention relates to a vibrating device and a manufacturing method thereof.

2. Description of the Related Art

Vibrating devices have been widely applied, for example, to acoustic apparatuses or to alarming apparatuses that transmit vibrations outside. The vibrating devices may be used for the double purpose of emitting a sound and transmitting vibrations. An example of a vibrating device is disclosed in Japanese Unexamined Patent Application Publication No. 2003-023697 listed below. This vibrating device has a piezoelectric diaphragm accommodated in a case. Inserted terminals are connected to the piezoelectric diaphragm. The inserted terminals are extended out of the case and laid on the side faces and the bottom surface of the case. Portions of the inserted terminals positioned on the bottom surface are connected to an external device by soldering.

In the case of the vibrating device described in Japanese Unexamined Patent Application Publication No. 2003-023697, vibrations are transmitted to the outside through the case and the inserted terminals. Accordingly, reliable transmission of the vibrations to the outside requires reliable joining between the piezoelectric diaphragm and the inserted terminals. Improving the reliability of joining between the piezoelectric diaphragm and the inserted terminals may lead to a decrease in productivity.

SUMMARY OF THE INVENTION

Preferred embodiments of the present invention provide vibrating devices that are each able to improve productivity, reliability, and vibration efficiency and manufacturing methods of such vibrating devices.

A vibrating device according to a preferred embodiment of the present invention includes a diaphragm including a vibrating portion and a fixation portion, a vibrator at the vibrating portion, and a fixation electrode. In the vibrating device, the fixation portion includes a first side portion and a second side portion that extend in different directions. The diaphragm and the fixation electrode are provided together integrally as a single monolithic member. The vibrating portion extends from the first side portion, and the fixation electrode extends from the second side portion.

A method of manufacturing a vibrating device according to a preferred embodiment of the present invention includes a step of providing a first plate that includes a fixation electrode portion and a diaphragm portion including a vibrating portion and a fixation portion and in which the fixation electrode portion and the diaphragm portion are integrally formed from a single monolithic member. The method of manufacturing the vibrating device also includes a step of providing a vibrator.

Preferred embodiments of the present invention provide vibrating devices that are each able to improve productivity, reliability, and vibration efficiency and manufacturing methods of such vibrating devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the drawings to clarify the present invention.

Note that each preferred embodiment described herein is merely an example. Configurations described may be partially replaced or combined with one another between different preferred embodiments.

Figure 1:
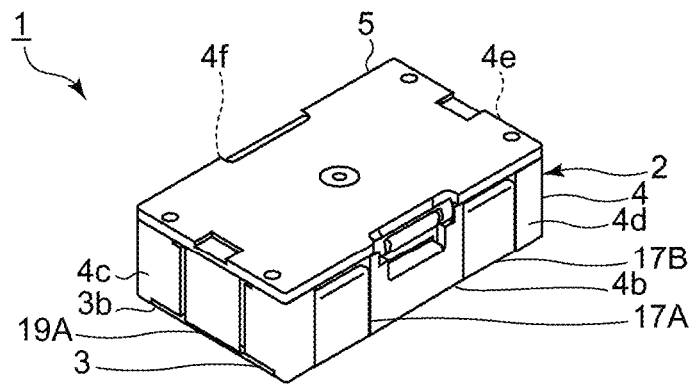
FIG. 1 is a perspective view illustrating a vibrating device according to a first preferred embodiment of the present invention.
Figure 2:
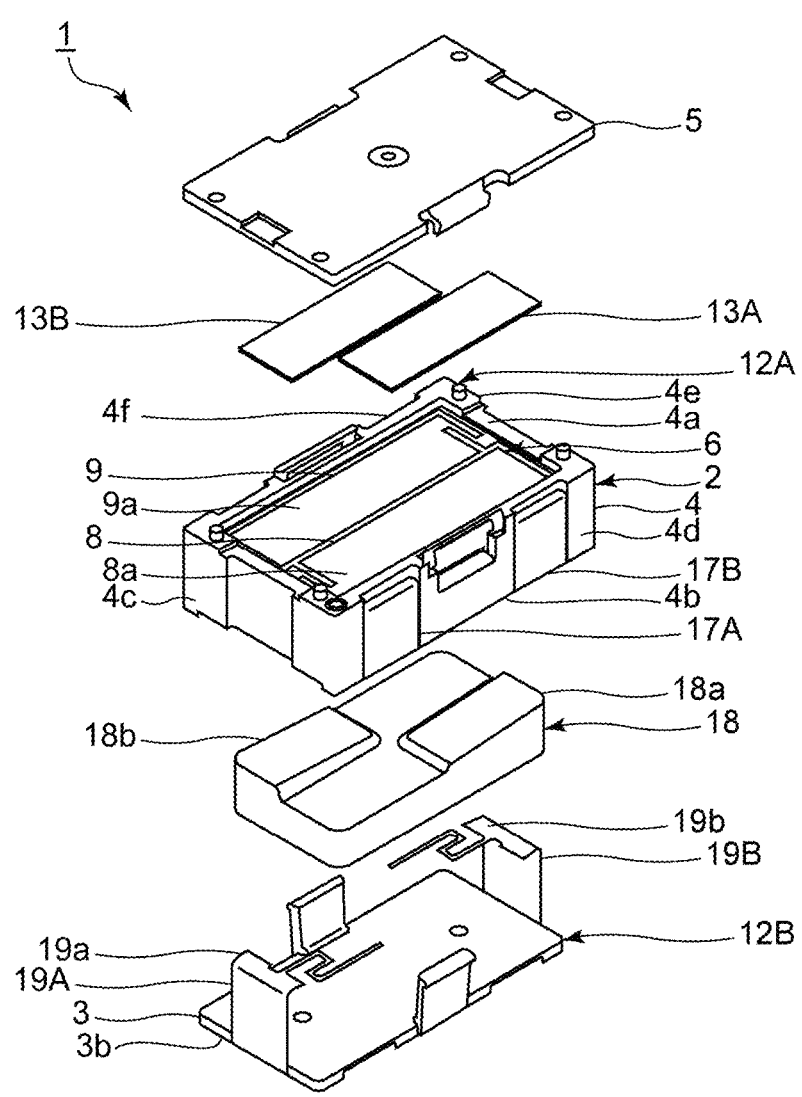
FIG. 2 is an exploded perspective view illustrating the vibrating device according to the first preferred embodiment of the present invention.

FIG. 1 is a perspective view illustrating a vibrating device according to a first preferred embodiment of the present invention. FIG. 2 is an exploded perspective view illustrating the vibrating device according to the first preferred embodiment of the present invention.

As illustrated in FIG. 1, a vibrating device 1 includes a housing 2. As illustrated in FIG. 2, the vibrating device 1 includes a diaphragm 6, and the diaphragm 6 is accommodated in the housing 2. The housing 2 includes a base portion 3, a sidewall portion 4 on the base portion 3, and a lid portion 5 on the sidewall portion 4.

The sidewall portion 4 is preferably shaped like a frame, for example. More specifically, the sidewall portion 4 preferably includes a first opening-end surface 4a and a second opening-end surface 4b that are opposite to each other. The sidewall portion 4 also includes four outer surfaces connected to the first opening-end surface 4a and the second opening-end surface 4b. In the present preferred embodiment, the four outer surfaces include a first outer surface 4c, a second outer surface 4d, a third outer surface 4e, and a fourth outer surface 4f. The lid portion 5 is disposed to close the first opening-end surface 4a of the sidewall portion 4. The base portion 3 is disposed to close the second opening-end surface 4b of the sidewall portion 4. The base portion 3 has a bottom surface 3b. The housing 2 is shaped like a cuboid in the present preferred embodiment. Note that the shape of the housing 2 is not limited to this.

The housing 2 is preferably made of a suitable synthetic resin. The synthetic resin is, for example, LCP (liquid crystal polymer), PEEK (polyether ether ketone), or PPS (polyphenylene sulfide). The base portion 3, the sidewall portion 4, and the lid portion 5 of the housing 2 may be made of materials different from one another.

Fixation electrodes 17A, 17B, 17C, and 17D are provided on outer surfaces of the sidewall portion 4 to extend onto the bottom surface 3b of the base portion 3. The fixation electrodes 17A to 17D are preferably fixed to an external device, for example, by soldering. More specifically, the fixation electrodes 17A to 17D are joined, for example, to a mounting circuit board. In this case, the vibration of the vibrating device 1 is transmitted to the outside through the fixation electrodes 17A to 17D and the housing 2.

Figure 3:
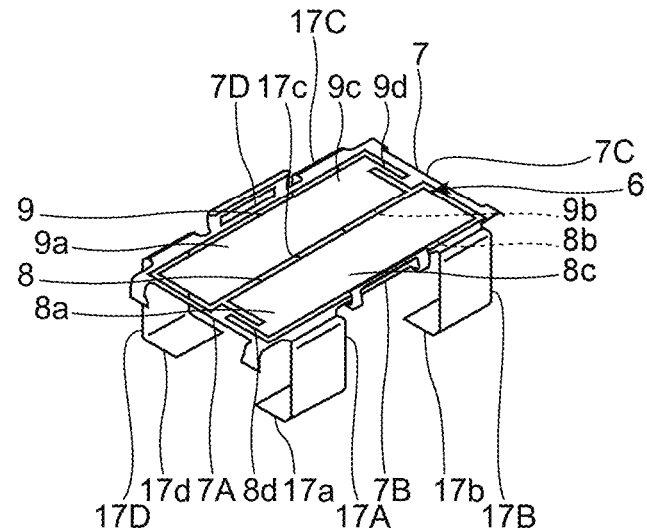
FIG. 3 is a perspective view illustrating a diaphragm and fixation electrodes in the first preferred embodiment of the present invention.

FIG. 3 is a perspective view illustrating the diaphragm and the fixation electrodes in the first preferred embodiment of the present invention.

The diaphragm 6 preferably includes a first vibrating portion 8 and a second vibrating portion 9. The diaphragm 6 also includes a fixation portion 7. The fixation portion 7 is fixed to the sidewall portion 4 of the housing 2. The fixation portion 7 is preferably shaped like a frame, for example. More specifically, the fixation portion 7 has a first side portion 7A, a second side portion 7B, a third side portion 7C, and a fourth side portion 7D. The second side portion 7B and the fourth side portion 7D extend in a direction perpendicular to the first side portion 7A and oppose each other. The third side portion 7C extends in the same direction as the first side portion 7A to oppose the first side portion 7A. Accordingly, the extending directions of the first side portion 7A and the second side portion 7B are different by 90 degrees in the present preferred embodiment. The extending directions of the third side portion 7C and the fourth side portion 7D are also different by 90 degrees. Note that the angle between the first side portion 7A and the second side portion 7B is not limited to 90 degrees and the angle between the third side portion 7C and the fourth side portion 7D is not limited to 90 degrees, either. Also note that as illustrated in FIG. 2, the first outer surface 4c is positioned adjacent to the first side portion 7A, the second outer surface 4d is positioned adjacent to the second side portion 7B, the third outer surface 4e is positioned adjacent to the third side portion 7C, and the fourth outer surface 4f is positioned adjacent to the fourth side portion 7D.

As illustrated in FIG. 3, the first vibrating portion 8 extends from the first side portion 7A, and the second vibrating portion 9 extends from the third side portion 7C. The first vibrating portion 8 and the second vibrating portion 9 each preferably include a cantilever structure with a free end. Note that the first vibrating portion 8 is not connected to the second side portion 7B and the second vibrating portion 9 is not connected to the fourth side portion 7D. As viewed in plan, the first vibrating portion 8 and the second vibrating portion 9 are in point symmetry with respect to the center of the internal circumference of the fixation portion 7. When the first vibrating portion 8 and the second vibrating portion 9 are viewed in the extending direction of the first side portion 7A, the first vibrating portion 8 and the second vibrating portion 9 overlap each other. The term "viewed in plan" as used herein means that an object is viewed in a direction normal to the lid portion 5.

The arrangement of the first vibrating portion 8 and the second vibrating portion 9 is not limited to the above. It is preferable, however, to configure the first vibrating portion 8 and the second vibrating portion 9 as illustrated in the present preferred embodiment because this can increase the amount of displacement of vibration and can improve stability of vibration.

The first vibrating portion 8 includes a first principal surface 8a and a second principal surface 8b that are opposite to each other. The first principal surface 8a is positioned adjacent to the lid portion 5 of the housing 2, whereas the second principal surface 8b is positioned adjacent to the base portion 3. The second vibrating portion 9 includes a first principal surface 9a and a second principal surface 9b that are opposite to each other. The first principal surface 9a is positioned adjacent to the lid portion 5 of the housing 2, whereas the second principal surface 9b is positioned adjacent to the base portion 3. The first vibrating portion 8, the second vibrating portion 9, and the fixation portion 7 are positioned on a same or substantially a same plane. The first vibrating portion 8 and the second vibrating portion 9, however, may include respective portions that are closer than the fixation portion 7 to the base portion 3 because a mass-adding body is disposed, for example, which will be described later.

The first vibrating portion 8 of the present preferred embodiment includes a tabular portion 8c and a link portion 8d. The tabular portion 8c preferably has a flat rectangular or substantially rectangular shape, and the link portion 8d preferably has a meandering or serpentine shape. One end of the link portion 8d is connected to the tabular portion 8c, and another end of the link portion 8d is connected to the fixation portion 7. Accordingly, the tabular portion 8c is connected to the fixation portion 7 with the link portion 8d interposed therebetween. The second vibrating portion 9 includes a tabular portion 9c and a link portion 9d. The tabular portion 9c has a flat rectangular or substantially rectangular shape, and the link portion 9d has a meandering or serpentine shape. One end of the link portion 9d is connected to the tabular portion 9c, and another end of the link portion 9d is connected to the fixation portion 7. Accordingly, the tabular portion 9c is connected to the fixation portion 7 with the link portion 9d interposed therebetween. Due to the link portions 8d and 9d having meandering or serpentine shapes, the influence of stress acting on the vicinities of the link portions 8d and 9d during vibration can be reduced, which can improve the efficiency of vibration. Moreover, even in a case, for example, of the vibrating device 1 being dropped and receiving a mechanical impact, the link portions 8d and 9d act like springs and thereby reduce the stress of the mechanical impact. This improves the impact resistance of the vibrating device 1.

Note that the shapes of the link portions 8d and 9d are not limited to the meandering or serpentine shapes but may also be shaped like straight lines, for example. Moreover, both of the tabular portion 8c and the link portion 8d may have flat rectangular or substantially rectangular shapes and may define, for example, one flat rectangular or substantially rectangular first vibrating portion 8. Both of the tabular portion 9c and the link portion 9d may have flat rectangular or substantially rectangular shapes and may define, for example, one flat rectangular or substantially rectangular second vibrating portion 9. In the present preferred embodiment, the diaphragm 6 includes the first vibrating portion 8 and the second vibrating portion 9. It is sufficient, however, that the diaphragm 6 includes at least one vibrating portion.

The fixation electrode 17A and the fixation electrode 17B extend from the second side portion 7B of the fixation portion 7. Similarly, the fixation electrode 17C and the fixation electrode 17D extend from the fourth side portion 7D of the fixation portion 7. Accordingly, the diaphragm 6 and fixation electrodes 17A to 17D define a single component in the present preferred embodiment. The diaphragm 6 is an electroconductive member which is preferably made of the same material as the fixation electrodes 17A to 17D.

More specifically, the second side portion 7B includes respective portions that pass through the sidewall portion 4 and extend to the fixation electrodes 17A and 17B. In the present preferred embodiment, the fixation electrodes 17A and 17B extend from the second side portion 7B in directions parallel or substantially parallel to the direction normal to the first principal surface 8a of the first vibrating portion 8. The fourth side portion 7D includes respective portions that pass through the sidewall portion 4 and extend to the fixation electrodes 17C and 17D. In the present preferred embodiment, the fixation electrodes 17C and 17D extend from the fourth side portion 7D in directions parallel or substantially parallel to the direction normal to the first principal surface 9a of the second vibrating portion 9. Note that the first principal surface 8a of the first vibrating portion 8, the first principal surface 9a of the second vibrating portion 9, and the first to fourth side portions 7A to 7D are present on the same or substantially the same plane.

Each of the fixation electrodes 17A to 17D preferably includes a portion positioned on a corresponding outer surface of the sidewall portion 4 and also has a portion positioned on the bottom surface 3b of the base portion 3. More specifically, the fixation electrodes 17A and 17B each have the portion positioned on the second outer surface 4d. The fixation electrodes 17C and 17D each have the portion positioned on the fourth outer surface 4f.

Here, the fixation electrode 17A preferably includes a bent portion 17a. The term "bent portion" as used herein refers to a portion extending from the bend to the end of the fixation electrode. In the case of the fixation electrode 17A including multiple bends, the "bent portion" refers to a portion extending to the end of the fixation electrode 17A from the bend closest to the end. The bent portion 17a is a portion of the fixation electrode 17A that is positioned on the bottom surface 3b of the base portion 3. The bent portion 17a is in contact with the base portion 3. Similarly, the fixation electrodes 17B to 17D have respective bent portions 17b to 17d, and the bent portions 17b to 17d are positioned on the bottom surface 3b of the base portion 3. The bent portions 17b to 17d are in contact with the base portion 3. Multiple fixation electrodes are provided in the present preferred embodiment. It is sufficient, however, to have at least one fixation electrode.

As illustrated in FIG. 2, a first piezoelectric vibrator 13A is on the first principal surface 8a of the first vibrating portion 8. The first piezoelectric vibrator 13A is joined to the first vibrating portion 8 using an electroconductive adhesive. Note that a joining method of the first piezoelectric vibrator 13A to the first vibrating portion 8 is not limited to the above. The first piezoelectric vibrator 13A vibrates the first vibrating portion 8.

A second piezoelectric vibrator 13B is on the first principal surface 9a of the second vibrating portion 9. The second piezoelectric vibrator 13B is joined to the second vibrating portion 9 using the electroconductive adhesive. The second piezoelectric vibrator 13B vibrates the second vibrating portion 9. The first piezoelectric vibrator 13A and the second piezoelectric vibrator 13B have flat rectangular or substantially rectangular shapes in the present preferred embodiment although the shapes are not specifically limited. Note that the first piezoelectric vibrator 13A may be provided on the second principal surface 8b of the first vibrating portion 8. The second piezoelectric vibrator 13B may be provided on the second principal surface 9b of the second vibrating portion 9.

Figure 4:
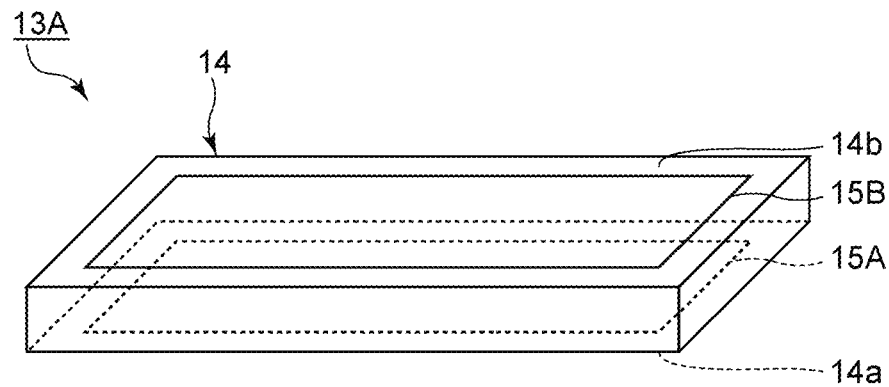
FIG. 4 is a perspective view illustrating a first piezoelectric vibrator in the first preferred embodiment of the present invention.

FIG. 4 is a perspective view illustrating the first piezoelectric vibrator in the first preferred embodiment of the present invention.

The first piezoelectric vibrator 13A includes a piezoelectric portion 14. The piezoelectric portion 14 includes a surface 14a positioned adjacent to the first vibrating portion and a surface 14b being opposite to the surface 14a. The piezoelectric portion 14 may be made of a piezoelectric material, such as, for example, a PZT-based ceramic material.

A first outer electrode 15A is provided on the surface 14a of the piezoelectric portion 14. A second outer electrode 15B is provided on the surface 14b. The first outer electrode 15A and the second outer electrode 15B are coupled to respective different potentials.

The piezoelectric portion 14 may be provided as a single-layer piezoelectric body or as a multilayer piezoelectric body in which multiple piezoelectric layers are laminated. In the case of the piezoelectric portion 14 being provided as the multilayer piezoelectric body, it is preferable to include an internal electrode between laminated piezoelectric layers. This enables the vibrating device 1 to be actuated even at a low voltage. The second piezoelectric vibrator 13B illustrated in FIG. 2 has a structure the same as or similar to that of the first piezoelectric vibrator 13A.

Figure 5:
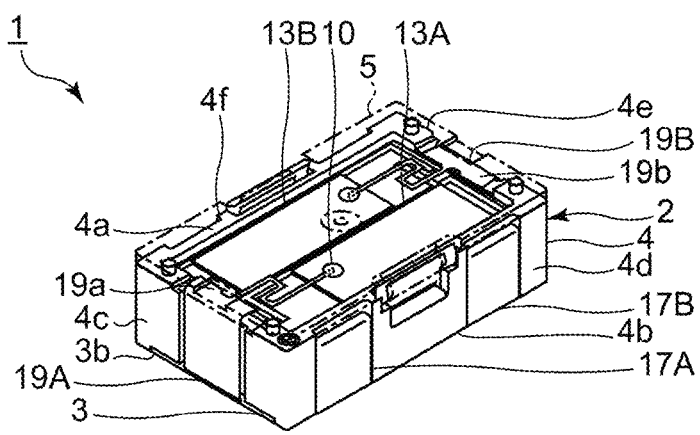
FIG. 5 is a perspective view illustrating the vibrating device according to the first preferred embodiment of the present invention when the vibrating device is viewed through a lid portion.

FIG. 5 is a perspective view illustrating the vibrating device according to the first preferred embodiment of the present invention when the vibrating device is viewed through the lid portion.

The vibrating device 1 includes a feeder electrode 19A that is electrically coupled to the first piezoelectric vibrator 13A and feeds electricity thereto. More specifically, the feeder electrode 19A is coupled to the second outer electrode 15B of the first piezoelectric vibrator 13A. The feeder electrode 19A is joined to the first piezoelectric vibrator 13A using a joining member 10. For example, the joining member 10 can be solder. The vibrating device 1 also includes a feeder electrode 19B that is electrically coupled to the second piezoelectric vibrator 13B and feeds electricity thereto. The feeder electrode 19B is joined to the second piezoelectric vibrator 13B using the joining member. The feeder electrode 19A and the feeder electrode 19B are fixed to the base portion 3.

The feeder electrode 19A includes a portion positioned on the first outer surface 4c of the sidewall portion 4 of the housing 2, a portion positioned on the first opening-end surface 4a, and a portion positioned on the first piezoelectric vibrator 13A. More specifically, the feeder electrode 19A includes a bent portion 19a. The bent portion 19a includes a portion positioned on the first opening-end surface 4a and a portion positioned on the first piezoelectric vibrator 13A. The feeder electrode 19B includes a portion positioned on the third outer surface 4e of the sidewall portion 4 of the housing 2, a portion positioned on the first opening-end surface 4a, and a portion positioned on the second piezoelectric vibrator 13B. The feeder electrode 19B includes a bent portion 19b. The bent portion 19b includes a portion positioned on the first opening-end surface 4a and a portion positioned on the second piezoelectric vibrator 13B. Note that the feeder electrode 19A and the feeder electrode 19B are not in contact with the diaphragm 6.

The first outer electrode 15A of the first piezoelectric vibrator 13A is electrically coupled to the diaphragm 6. The first outer electrode 15A is coupled, for example, to a ground potential through the diaphragm 6 and the fixation electrodes 17A to 17D. The second piezoelectric vibrator 13B is configured in the same or substantially the same manner.

Applying an alternating electric field to the first piezoelectric vibrator 13A causes the first piezoelectric vibrator 13A to expand and contract in in-plane direction. The first vibrating portion 8 is thus vibrated in a flexural vibration mode. Similarly, applying an alternating electric field to the second piezoelectric vibrator 13B causes the second piezoelectric vibrator 13B to expand and contract in in-plane direction. The second vibrating portion 9 is thus vibrated in a flexural vibration mode. In the present preferred embodiment, the vibrations of the first vibrating portion 8 and the second vibrating portion 9 are the same. The expression "vibrations are the same" as used herein means that the vibrations of the first and second vibrating portions 8 and 9 are substantially the same to the extent that both vibrations do not largely deteriorate the characteristics of the vibrating device 1.

It is sufficient that the vibrating device 1 includes vibrators that can vibrate the first vibrating portion 8 and the second vibrating portion 9, and the type of the vibrators is not limited to the piezoelectric vibrator.

As illustrated in FIG. 2, a mass-adding body 18 is connected to the second principal surface 8b of the first vibrating portion 8 and also to the second principal surface 9b of the second vibrating portion 9. More specifically, the free ends of the first vibrating portion 8 and the second vibrating portion 9 are connected to the mass-adding body 18. It is sufficient that the mass-adding body 18 is connected to a portion of the first vibrating portion 8 adjacent to the free end thereof and also to a portion of the second vibrating portion 9 adjacent to the free end thereof. In other words, the mass-adding body 18 is not necessarily connected to the free ends themselves of the first vibrating portion 8 and the second vibrating portion 9. It is desirable, however, that the mass-adding body 18 be connected to the free ends of the first vibrating portion 8 and the second vibrating portion 9. This enables the magnitude of vibration to increase.

In the present preferred embodiment, the mass-adding body 18 vibrates to reciprocally move along a straight line that connects the lid portion 5 with the base portion 3. Accordingly, the first vibrating portion 8, the second vibrating portion 9, and the mass-adding body 18 are vibrated in an almost entire region inside the housing 2 of the vibrating device 1. This enables the magnitude of vibration to increase effectively and enables the size of the vibrating device 1 to be reduced at the same time.

Figure 6:
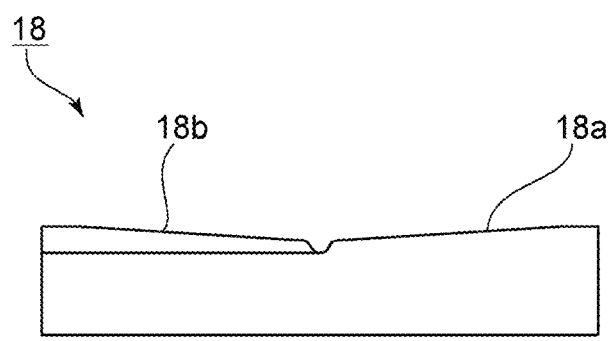
FIG. 6 is a side view illustrating a mass-adding body in the first preferred embodiment of the present invention.

FIG. 6 is a side view illustrating the mass-adding body in the first preferred embodiment of the present invention.

As illustrated in FIGS. 2 and 6, the mass-adding body 18 includes a first inclined portion 18a and a second inclined portion 18b on the surface thereof opposing the first vibrating portion 8 and the second vibrating portion 9 of the diaphragm 6. The first inclined portion 18a is positioned in the region of the mass-adding body 18 that opposes the first vibrating portion 8. More specifically, in the direction in which the first side portion 7A and the third side portion 7C of the fixation portion 7 of the diaphragm 6 oppose each other, the first inclined portion 18a is positioned between the edge of the mass-adding body 18 adjacent to the third side portion 7C and a central portion of the mass-adding body 18. The first inclined portion 18a inclines such that the first inclined portion 18a comes closer to the first vibrating portion 8 as the distance from the third side portion 7C becomes smaller.

The second inclined portion 18b is positioned on the mass-adding body 18 to oppose the second vibrating portion 9. More specifically, in the direction in which the first side portion 7A and the third side portion 7C of the fixation portion 7 of the diaphragm 6 oppose each other, the second inclined portion 18b is positioned between the edge of the mass-adding body 18 adjacent to the first side portion 7A and a central portion of the mass-adding body 18. The second inclined portion 18b inclines such that the second inclined portion 18b comes closer to the second vibrating portion 9 as the distance from the first side portion 7A becomes smaller.

On the surface of the mass-adding body 18 at which the first and second inclined portions 18a and 18b are provided, the surface where the first and second inclined portions 18a and 18b are not present is made flat. Due to the mass-adding body 18 including the first and second inclined portions 18a and 18b, the mass-adding body 18 can be displaced more largely toward the lid portion 5. This enables the magnitude of vibration to increase even largely.

Note that the shape of the mass-adding body 18 is not limited to the above. The mass-adding body 18 may be a cuboid having no inclined portion. The mass-adding body 18 is made of a suitable metal, a composite of a metal and a resin, or a ceramic material. It is preferable that the mass-adding body 18 be made of a high-density metal, such as tungsten, that can impart mass effectively. This enables the size of the vibrating device 1 to be reduced more easily.

In the present preferred embodiment, the center of the fixation portion 7 of the diaphragm 6 preferably overlaps the center of gravity of the mass-adding body 18. However, the positional relationship between the diaphragm 6 and the mass-adding body 18 is not limited to this.

The following points characterize the present preferred embodiment. 1) The diaphragm 6 and the fixation electrodes 17A to 17D are preferably provided integrally as a single monolithic member. 2) The first vibrating portion 8 extends from the first side portion 7A, the fixation electrodes 17A and 17B extend from the second side portion 7B, the second vibrating portion 9 extends from the third side portion 7C, and the fixation electrodes 17C and 17D extend from the fourth side portion 7D.

The diaphragm 6 and the fixation electrodes 17A to 17D are preferably formed integrally as a single monolithic member, and no joint exists between the diaphragm 6 and the fixation electrodes 17A to 17D. This eliminates the likelihood of the joining strength being deteriorated by vibration, which can thus improve the reliability of the vibrating device 1. In addition, this can eliminate a step of providing a member for joining the diaphragm 6 to the fixation electrodes 17A to 17D and a step of joining the diaphragm 6 to the fixation electrodes 17A to 17D, which can thus improve manufacturing productivity. Moreover, since the vibrating device 1 does not need a member or the like to join the diaphragm 6 to the fixation electrodes 17A to 17D, the size of the vibrating device 1 can be reduced.

Here, the fixation portion 7 of the diaphragm 6 is a portion to which the first vibrating portion 8 and the second vibrating portion 9 are fixed, and accordingly the fixation portion 7 is displaced slightly during vibration of the first vibrating portion 8 and the second vibrating portion 9. For example, if the first vibrating portion and the fixation electrodes were extended from the first side portion, the rigidity of the first side portion would increase due to the presence of the fixation electrodes and would interfere with vibration of the first vibrating portion. In the present preferred embodiment, however, the first vibrating portion 8 extends from the first side portion 7A, and the fixation electrodes 17A and 17B extend from the second side portion 7B, while the first side portion 7A and the second side portion 7B extend in different directions. With this configuration, the vibration of the first vibrating portion 8 is not interfered significantly. Similarly, the second vibrating portion 9 extends from the third side portion 7C, and the fixation electrodes 17C and 17D extend from the fourth side portion 7D. Accordingly, the vibration of the second vibrating portion 9 is not interfered significantly. This can improve the efficiency of vibration, and the vibrating device 1 can generate large vibrations even if it is small.

In the present preferred embodiment, the diaphragm 6, the fixation electrodes 17A to 17D, and the sidewall portion 4 of the housing 2 define a first insert-molded body 12A. More specifically, a portion of the fixation portion 7 of the diaphragm is provided, and thus fixed, inside the sidewall portion 4. Moreover, the fixation electrodes 17A to 17D are integrally provided with the diaphragm 6. Accordingly, the diaphragm 6 and the fixation electrodes 17A to 17D are fixed to each other in a preferred manner without needing to use a joint or the like. This enables the size of the vibrating device 1 to be reduced more easily.

The feeder electrodes 19A and 19B and the base portion 3 of the housing 2 define a second insert-molded body 12B. More specifically, a portion of the feeder electrode 19A and a portion of the feeder electrode 19B are inside the base portion 3. Accordingly, the feeder electrodes 19A and 19B are fixed in a preferred manner without needing to use a joint or the like. This enables the size of the vibrating device 1 to be reduced even more easily. Note that the sidewall portion 4 and the base portion 3 of the housing 2 need not be formed as the insert-molded bodies.

Moreover, in the present preferred embodiment, the first vibrating portion 8 and the second vibrating portion 9 of the diaphragm 6 are cantilever structures including respective free ends. The first vibrating portion 8 and the second vibrating portion 9, however, may be structured such that both end portions of each vibrating portion are supported. Also in this case, the diaphragm 6 and the fixation electrodes 17A to 17D are provided integrally as a single monolithic member, which can thus improve manufacturing productivity and can reliably transmit the vibration to the outside.

A non-limiting example method of manufacturing the vibrating device 1 according to the first preferred embodiment will be described below.

Figure 7:
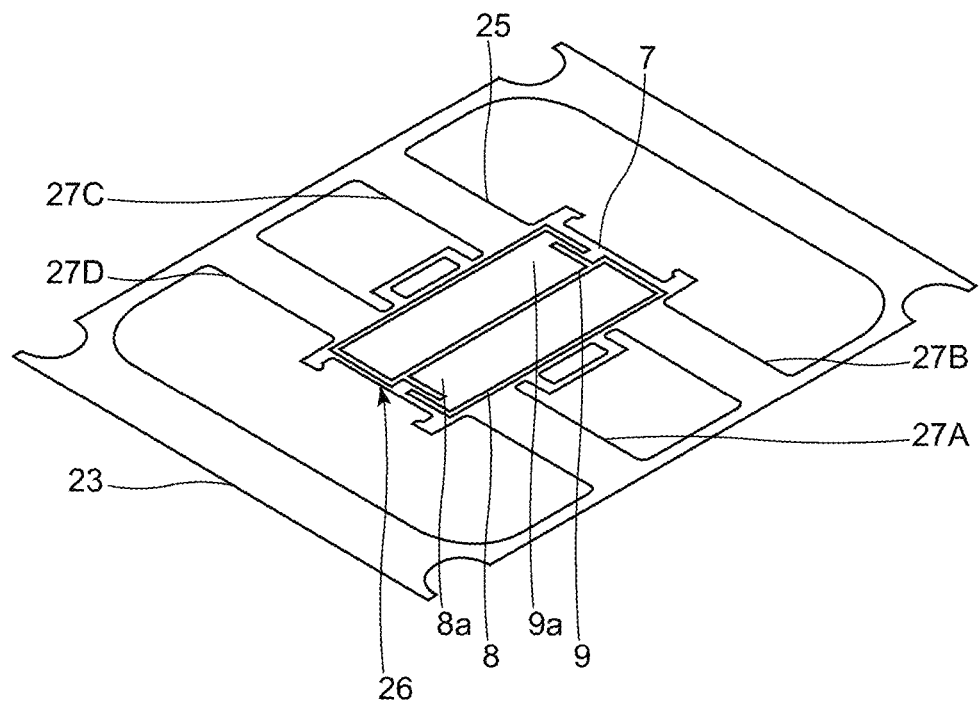
FIG. 7 is a perspective view illustrating a first plate to be used in manufacturing the vibrating device according to the first preferred embodiment of the present invention.
Figure 8:
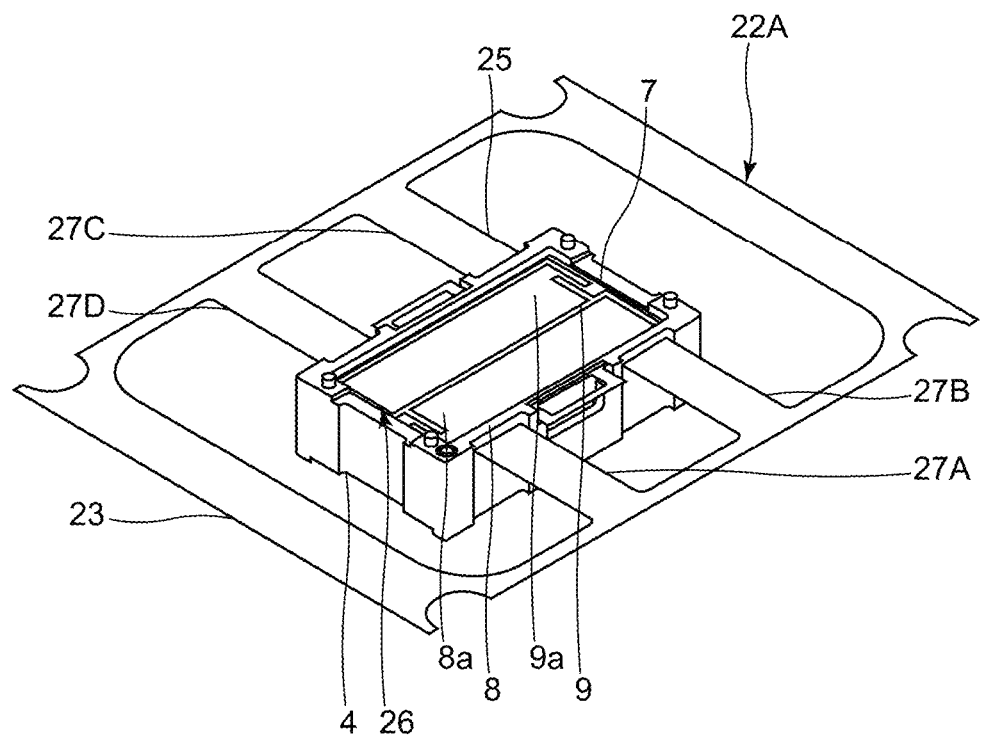
FIG. 8 is a perspective view explaining an example method of manufacturing the vibrating device according to the first preferred embodiment of the present invention.
Figure 9:
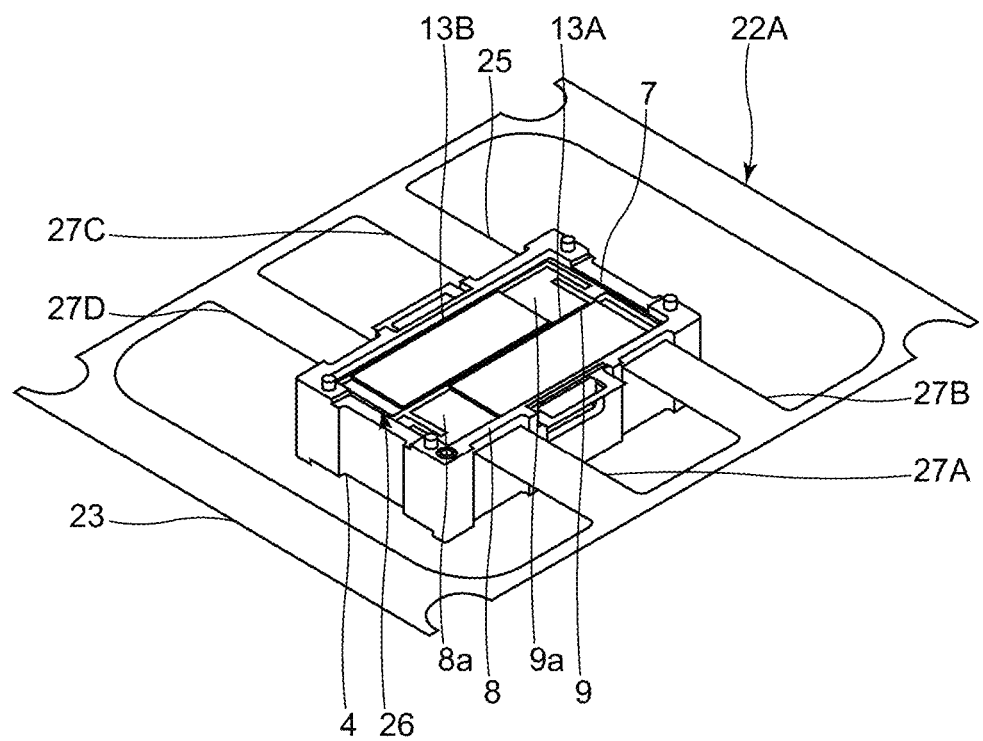
FIG. 9 is a perspective view explaining the example method of manufacturing the vibrating device according to the first preferred embodiment of the present invention.
Figure 10:
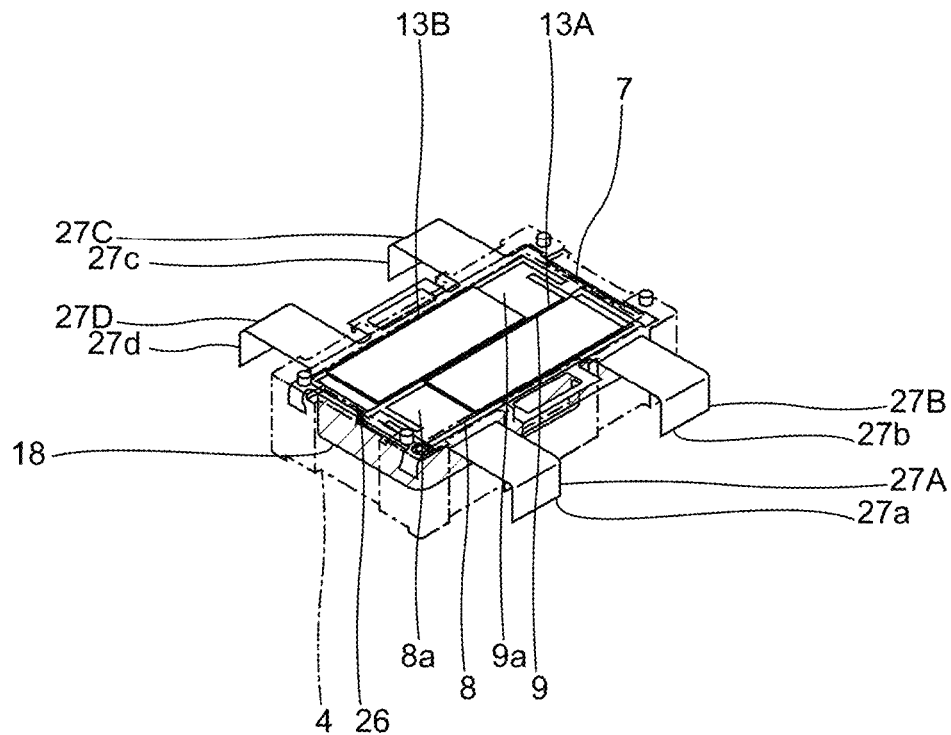
FIG. 10 is a perspective view explaining the example method of manufacturing the vibrating device according to the first preferred embodiment of the present invention.

FIG. 7 is a perspective view illustrating a first plate to be used in manufacturing the vibrating device according to the first preferred embodiment of the present invention. FIG. 8 is a perspective view explaining the example method of manufacturing the vibrating device according to the first preferred embodiment of the present invention. FIG. 9 is another perspective view explaining the example method of manufacturing the vibrating device according to the first preferred embodiment of the present invention. FIG. 10 is another perspective view explaining the example method of manufacturing the vibrating device according to the first preferred embodiment of the present invention. Note that in FIG. 10, the inside of the sidewall portion is viewed through the sidewall portion, and the mass-adding body is indicated by hatching.

A first plate 25 as illustrated in FIG. 7 is prepared. The first plate 25 includes a fixation electrode portion 27A, a fixation electrode portion 27B, a fixation electrode portion 27C, and a fixation electrode portion 27D. The fixation electrode portion 27A is a portion to become the fixation electrode 17A illustrated in FIG. 3. Similarly, the fixation electrode portion 27B, the fixation electrode portion 27C, and the fixation electrode portion 27D are portions to become the fixation electrode 17B, the fixation electrode 17C, and the fixation electrode 17D, respectively.

The first plate 25 also includes a diaphragm portion 26 that has the first vibrating portion 8, the second vibrating portion 9, and the fixation portion 7. The diaphragm portion 26 is a portion to become the diaphragm 6. The first plate 25 further includes a frame-shaped connection portion 23 to which the fixation electrode portions 27A to 27D are connected. Note that the first plate 25 does not necessarily include the connection portion 23. The first plate 25 is an electrically conductive member.

Next, as illustrated in FIG. 8, an insert-molded body 22A is preferably formed by insert-molding. In the insert-molded body 22A, the sidewall portion 4 of the housing 2 is structured to accommodate a portion of the first plate 25. Here, the sidewall portion 4 is formed such that at least a portion of the fixation portion 7 of the diaphragm portion 26 is positioned inside the sidewall portion 4 and the fixation electrode portions 27A to 27D penetrate the sidewall portion 4. With this configuration, the diaphragm portion 26 and the fixation electrode portions 27A to 27D can be fixed to the sidewall portion 4 without using joints or the like.

Next, as illustrated in FIG. 9, the first piezoelectric vibrator 13A is provided on the first principal surface 8a of the first vibrating portion 8 included in the diaphragm portion 26 of the first plate 25. Similarly, the second piezoelectric vibrator 13B is provided on the first principal surface 9a of the second vibrating portion 9 included in the diaphragm portion 26 of the first plate 25. Next, as illustrated in FIG. 10, the mass-adding body 18 is connected to the free ends of the first vibrating portion 8 and the second vibrating portion 9.

Subsequently, a bent portion 27a is formed by bending the fixation electrode portion 27A. Similarly, a bent portion 27b, a bent portion 27c, and a bent portion 27d are formed respectively by bending the fixation electrode portion 27B, the fixation electrode portion 27C, and the fixation electrode portion 27D. Note that the fixation electrode portions 27A to 27D are detached from the connection portion 23 illustrated in FIG. 9 when the fixation electrode portions 27A to 27D are bent. The first plate 25, however, may be configured such that the fixation electrode portions 27A to 27D can be bent without being detached from the connection portion 23.

Figure 11:
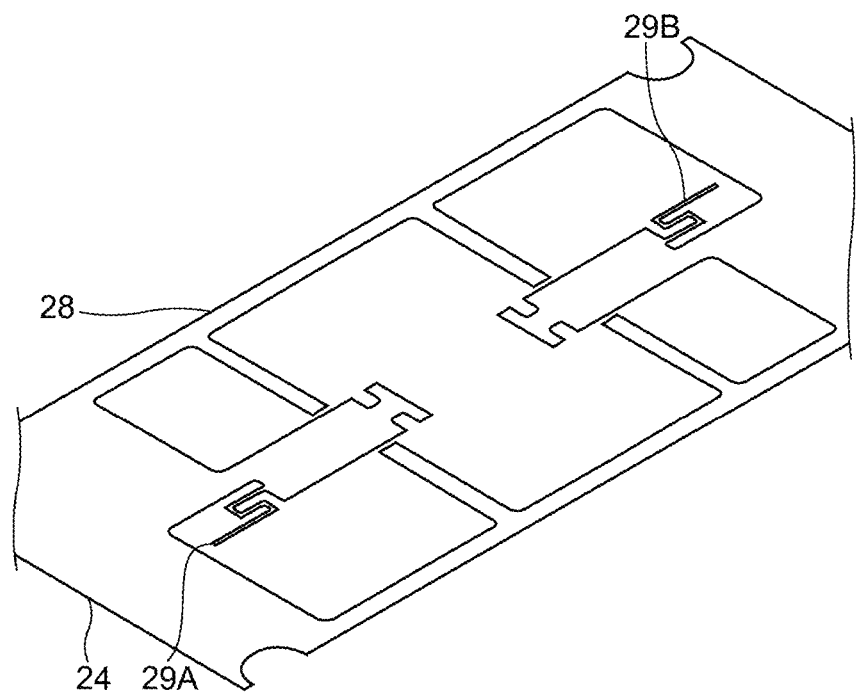
FIG. 11 is a perspective view illustrating a second plate to be used in manufacturing the vibrating device according to the first preferred embodiment of the present invention.
Figure 12:
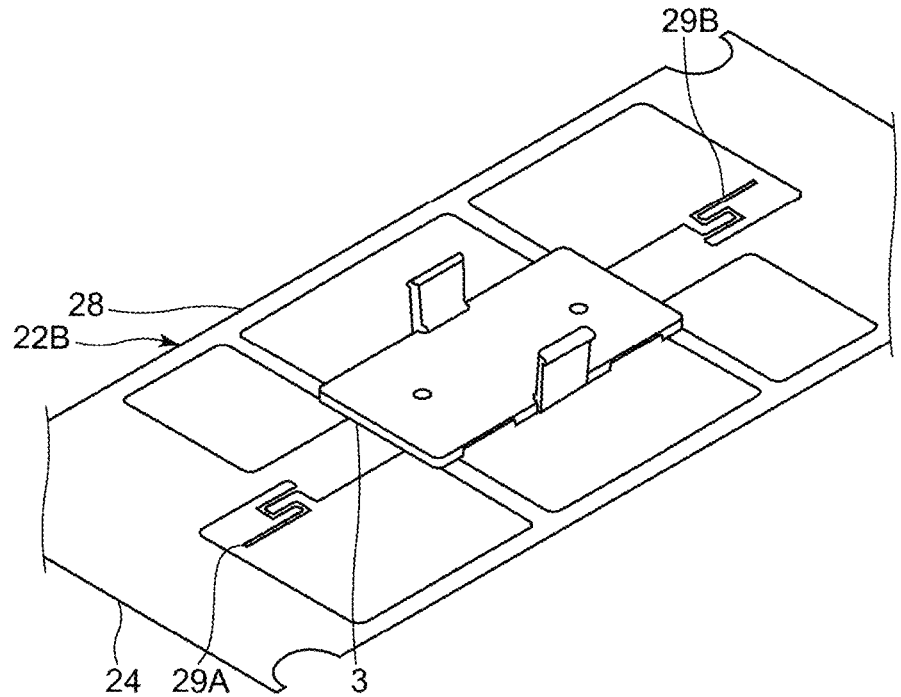
FIG. 12 is a perspective view explaining the example method of manufacturing the vibrating device according to the first preferred embodiment of the present invention.
Figure 13:
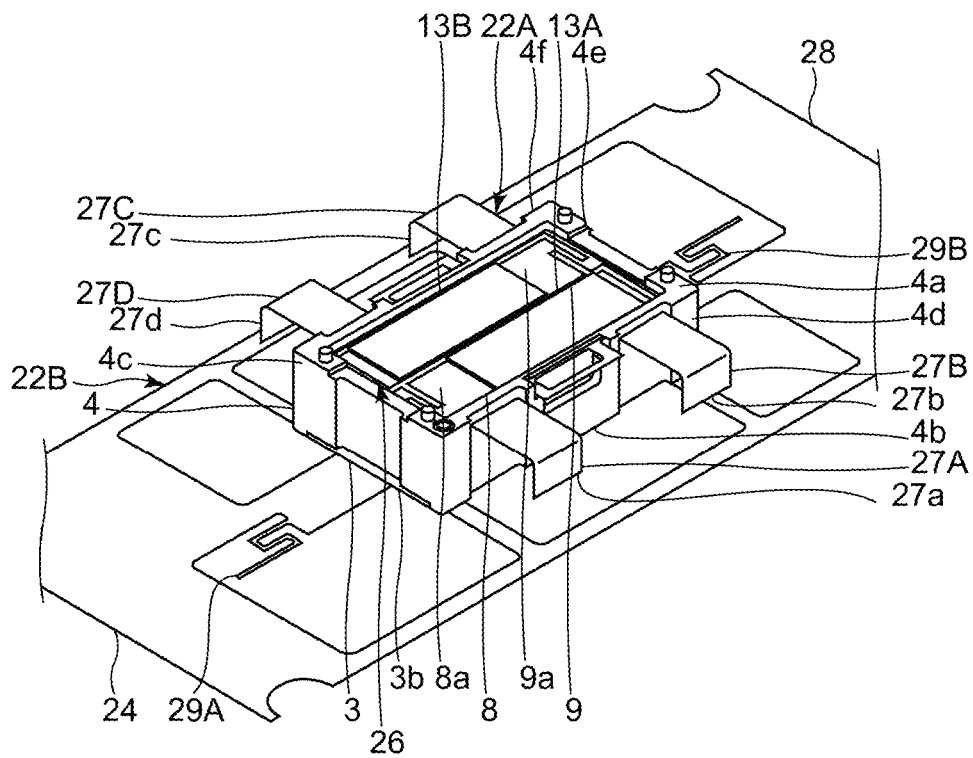
FIG. 13 is a perspective view explaining the example method of manufacturing the vibrating device according to the first preferred embodiment of the present invention.
Figure 14:
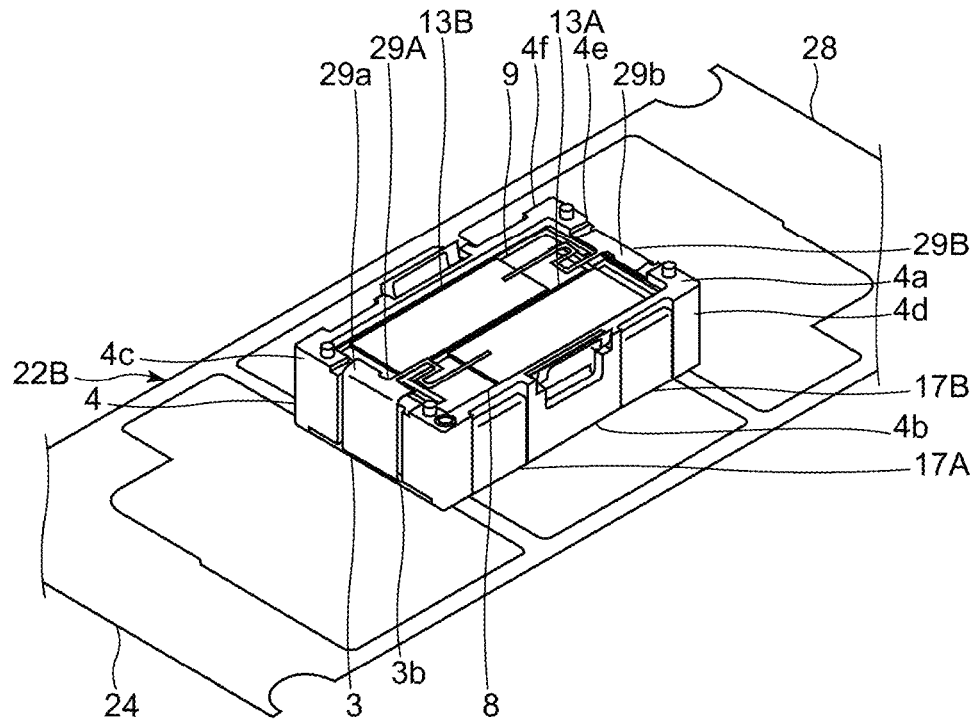
FIG. 14 is a perspective view explaining the example method of manufacturing the vibrating device according to the first preferred embodiment of the present invention.

FIG. 11 is a perspective view illustrating a second plate to be used in manufacturing the vibrating device according to the first preferred embodiment of the present invention. FIG. 12 is a perspective view explaining the example method of manufacturing the vibrating device according to the first preferred embodiment of the present invention. FIG. 13 is another perspective view explaining the example method of manufacturing the vibrating device according to the first preferred embodiment of the present invention. FIG. 14 is another perspective view explaining the example method of manufacturing the vibrating device according to the first preferred embodiment of the present invention.

Meanwhile, a second plate 28 is prepared. As illustrated in FIG. 11, the second plate 28 includes a feeder electrode portion 29A and a feeder electrode portion 29B integrally formed therein. The feeder electrode portion 29A is a portion to become the feeder electrode 19A illustrated in FIG. 2, and the feeder electrode portion 29B is a portion to become the feeder electrode 19B. The second plate 28 also includes a connection portion 24 to which the feeder electrode portions 29A and 29B are connected. Note that the second plate 28 does not necessarily include the connection portion 24.

Next, as illustrated in FIG. 12, an insert-molded body 22B is formed by insert-molding. In the insert-molded body 22B, the base portion 3 of the housing 2 is structured to accommodate a portion of the second plate 28. Here, the base portion 3 is formed such that at least portions of the feeder electrode portions 29A and 29B are positioned inside the base portion 3. With this configuration, the feeder electrode portions 29A and 29B can be fixed to the base portion 3 without using joining members or the like.

Next, as illustrated in FIG. 13, the insert-molded body 22A and the insert-molded body 22B are joined together such that the base portion 3 covers the second opening-end surface 4b of the sidewall portion 4. Subsequently, the fixation electrode portion 27A is bent such that the bent portion 27a of the fixation electrode portion 27A comes to a position on the bottom surface 3b of the base portion 3. The fixation electrode portion 27A includes a portion positioned on a corresponding outer surface of the sidewall portion 4 and a portion positioned on the bottom surface 3b of the base portion 3. Similarly, the fixation electrode portions 27B to 27D are bent such that the bent portions 27b to 27d of respective fixation electrode portions 27B to 27D come to corresponding positions on the bottom surface 3b of the base portion 3. The fixation electrode portions 27B to 27D thus include respective portions positioned on corresponding outer surfaces of the sidewall portion 4 and include respective portions positioned on the bottom surface 3b of the base portion 3. Thus, the fixation electrodes 17A to 17D are preferably formed as illustrated in FIG. 14.

Next, a bent portion 29a is formed by bending the feeder electrode portion 29A of the second plate 28. Subsequently, a portion of the feeder electrode portion 29A to be positioned on the first outer surface 4c of the sidewall portion 4 is formed by bending the feeder electrode portion 29A. At the same time, the bent portion 29a is provided onto the first opening-end surface 4a of the sidewall portion 4 and also onto the first piezoelectric vibrator 13A. Accordingly, the feeder electrode portion 29A is provided on the first outer surface 4c, on the first opening-end surface 4a, and also on the first piezoelectric vibrator 13A.

Similarly, a bent portion 29b is formed by bending the feeder electrode portion 29B. Subsequently, a portion of the feeder electrode portion 29B to be positioned on the third outer surface 4e of the sidewall portion 4 is formed by bending the feeder electrode portion 29B. At the same time, the bent portion 29b is provided onto the first opening-end surface 4a of the sidewall portion 4 and also onto the second piezoelectric vibrator 13B. Accordingly, the feeder electrode portion 29B is provided onto the third outer surface 4e, onto the first opening-end surface 4a, and also onto the second piezoelectric vibrator 13B. Note that the feeder electrode portions 29A and 29B are disposed so as not to be in contact with the diaphragm 6. When the feeder electrode portions 29A and 29B are bent, the feeder electrode portions 29A and 29B are detached from the connection portion 24. The second plate 28, however, may be configured such that the feeder electrode portions can be bent without being detached from the connection portion.

Next, the feeder electrode portion 29A is coupled to the second outer electrode 15B of the first piezoelectric vibrator 13A. For example, soldering may be used to couple the feeder electrode portion 29A to the second outer electrode 15B. Similarly, the feeder electrode portion 29B is coupled to the second piezoelectric vibrator 13B. Next, the lid portion 5 illustrated in FIG. 1 is provided on the sidewall portion 4.

Figure 15:
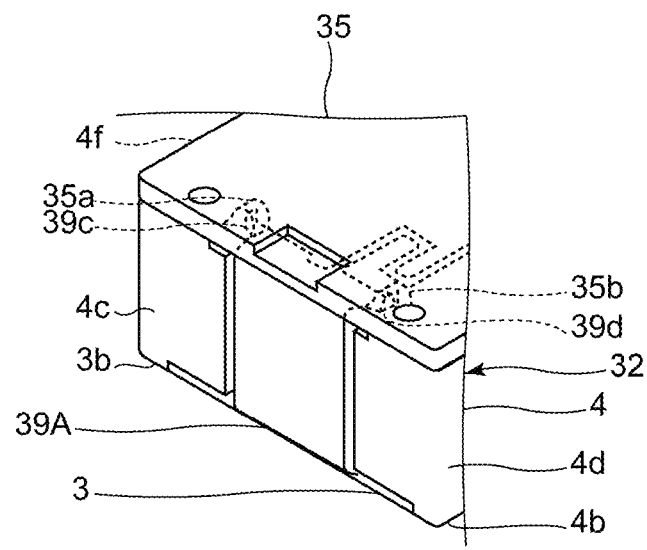
FIG. 15 is a perspective view illustrating the vicinity of a feeder electrode of a vibrating device according to a second preferred embodiment of the present invention.
Figure 16:
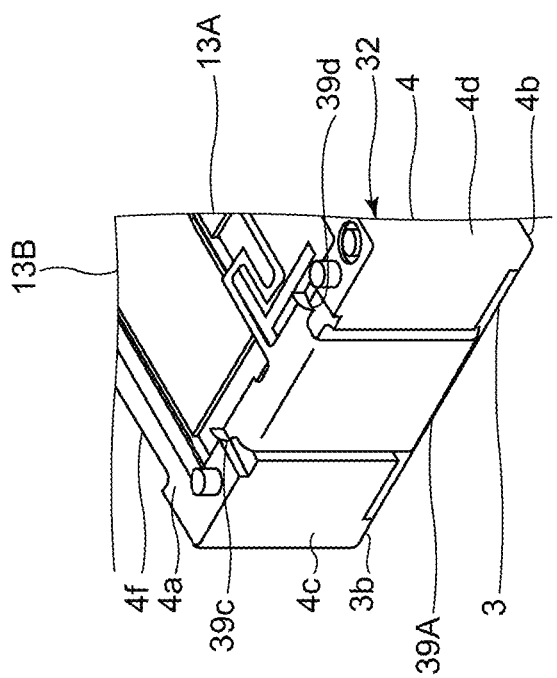
FIG. 16 is a perspective view illustrating the vicinity of FIG. 15 with a lid portion being omitted.

FIG. 15 is a perspective view illustrating the vicinity of a feeder electrode of a vibrating device according to a second preferred embodiment of the present invention. FIG. 16 is a perspective view illustrating the vicinity of the feeder electrode in FIG. 15 with the lid portion being omitted.

As illustrated in FIGS. 15 and 16, the second preferred embodiment is different from the first preferred embodiment in that a feeder electrode 39A includes a protrusion 39c and a protrusion 39d and in that a lid portion 35 of a housing 32 includes a recess 35a and a recess 35b. Another difference from the first preferred embodiment is that the protrusion 39c engages the recess 35a and the protrusion 39d engages the recess 35b. Note that the other feeder electrode opposite to the feeder electrode 39A also includes protrusions like those of the feeder electrode 39A and the protrusions engage respective recesses of the lid portion. Other elements of the vibrating device of the present preferred embodiment are the same as or similar to those of the vibrating device 1 of the first preferred embodiment.

For example, the expression "the protrusion 39c engages the recess 35a" as used herein means that the protrusion 39c is in contact at least with a portion of the inner surface of the recess 35a, the portion being positioned adjacent to the first outer surface 4c of the sidewall portion 4. The engagement between the protrusion 39c and the recess 35a can reduce the displacement of the feeder electrode 39A at least outward from the sidewall portion 4. This makes it difficult to detach the feeder electrode 39A from the first piezoelectric vibrator 13A. This is especially preferable, for example, in a case in which a portion of the feeder electrode 39A positioned on the first outer surface 4c is joined to an external device and the feeder electrode 39A is subjected to an external force in a direction outward from the sidewall portion 4. Also in a case in which a portion of the feeder electrode 39A positioned on the first outer surface 4c is joined to an external device by soldering or the like and the feeder electrode 39A is subjected to thermal expansion or the like, the displacement of the feeder electrode 39A can be reduced effectively.

In the present preferred embodiment, the feeder electrode 39A preferably includes the protrusion 39c and the protrusion 39d, and the protrusions 39c and 39d engage respective recesses 35a and 35b, which can further reduce the displacement of the feeder electrode 39A.

Note that the number and shapes of the protrusions of the feeder electrode 39A are not specifically limited. Alternatively, a recess or a through hole may be provided in the feeder electrode 39A, and a protrusion may be provided at the lid portion 35. In addition, the recess or the through hole of the feeder electrode 39A may engage the protrusion of the lid portion 35.

In the present preferred embodiment, the diaphragm 6 and the fixation electrodes are also preferably formed integrally as a single monolithic component. Accordingly, as is the case for the first preferred embodiment, the vibrating device according to the second preferred embodiment also can improve the manufacturing productivity and can reliably transmit the vibration to the outside.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibrating device, comprising:
   a diaphragm including a vibrating portion and a fixation portion;
   a vibrator provided at the vibrating portion; and
   a fixation electrode; wherein
   fixation portion includes a first side portion and a second side portion that extend in different directions;
   the diaphragm and the fixation electrode are provided integrally by a single monolithic member; and
   the vibrating portion extends from the first side portion and the fixation electrode extends from the second side portion.

2. The vibrating device according to claim 1, further comprising:
   a housing including a sidewall portion; wherein
   the fixation portion is fixed to the housing;
   the sidewall portion includes an outer surface; and
   the fixation electrode includes a portion positioned on the outer surface.

3. The vibrating device according to claim 2, wherein
   the diaphragm, the fixation electrode, and the sidewall portion of the housing are provided together as a single insert-molded body; and
   at least a portion of the fixation portion is inside the sidewall portion.

4. The vibrating device according to claim 2, wherein
   the housing includes a base portion including a bottom surface;
   the sidewall portion of the housing include a first opening-end surface and a second opening-end surface that are positioned opposite to each other;
   the base portion is at the second opening-end surface; and
   the fixation electrode includes a bent portion on the bottom surface.

5. The vibrating device according to claim 4, further comprising:
   a feeder electrode electrically coupled to the vibrator; wherein
   the feeder electrode and the base portion are provided as a single insert-molded body; and
   a portion of the feeder electrode includes a bent portion on the first opening-end surface.

6. The vibrating device according to claim 1, wherein
   the vibrator is a piezoelectric vibrator; and
   the vibrator is on one principal surface of the diaphragm.

7. The vibrating device according to claim 1, further comprising:
   a mass-adding body connected to the vibrating portion.

8. The vibrating device according to claim 1, wherein
   the fixation portion includes a third side portion opposite to the first side portion;
   the vibrating portion includes a first vibrating portion and a second vibrating portion; and
   the first vibrating portion extends from the first side portion, and the second vibrating portion extends from the third side portion.

9. The vibrating device according to claim 4, wherein the sidewall portion includes four outer surfaces connected to the first opening-end surface and the second opening-end surface.

10. The vibrating device according to claim 1, wherein the fixation electrode is structured to be joined to a circuit board.

11. The vibrating device according to claim 1, wherein the fixation portion is frame-shaped and includes four sides.

12. The vibrating device according to claim 8, wherein the first vibrating portion and the second vibrating portion are in point symmetry with respect to a center of an internal circumference of the fixation portion.

13. The vibrating device according to claim 8, wherein the first vibrating portion, the second vibrating portion, and the fixation portion a on a same or substantially a plane.

14. The vibrating device according to claim 1, wherein
   the vibrating portion includes a tabular portion and a link portion;
   the tabular portion has a flat rectangular or substantially rectangular shape; and
   the link portion has a meandering or serpentine shape.

15. The vibrating device according to claim 7, wherein the mass-adding body includes a first inclined portion and a second inclined portion opposing the diaphragm.

* * * * *